(12) United States Patent
Beck et al.

(10) Patent No.: US 6,383,573 B1
(45) Date of Patent: May 7, 2002

(54) PROCESS FOR MANUFACTURING COATED PLASTIC BODY

(75) Inventors: Eugen Beck, Triesenberg (LI); Jürgen Ramm, Sevelen; Heinrich Zimmermann, Werdenberg, both of (CH)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 09/572,089

(22) Filed: May 17, 2000

(51) Int. Cl.$^7$ .................................................. C08J 7/18
(52) U.S. Cl. ...................... 427/491; 204/192.1; 427/96; 427/123; 427/124; 427/162; 427/250; 427/255.23; 427/255.26; 427/255.28; 427/296; 427/304; 427/322; 427/488; 427/525; 427/531; 427/536; 427/540; 427/558; 427/575; 427/576; 427/580; 427/585; 438/474; 438/475; 438/584; 438/758
(58) Field of Search ................................. 427/536, 540, 427/558, 575, 488, 491, 296, 585, 525, 255.26, 255.28, 255.23, 96, 162, 531, 576, 580, 123, 124, 250, 304, 322; 204/192.1; 438/474, 475, 584, 758

(56) References Cited

U.S. PATENT DOCUMENTS

| 4,886,681 A | 12/1989 | Clabes et al. .................. 427/38 |
| 4,957,603 A | 9/1990 | Hennessey ............. 204/197.27 |
| 5,400,317 A | 3/1995 | Strasser et al. |

FOREIGN PATENT DOCUMENTS

| CH | 688042 | 3/1995 |
| CH | 688 042 | 4/1997 |
| DE | 19752889 | 6/1999 |
| DE | 197 52 889 | 6/1999 |
| EP | 507113 B1 | 10/1992 |

OTHER PUBLICATIONS

Legeay et al., "Surface Modification of Natural or Synthetic Polymers by Cold Plasmas", pp. 29–39 (No Date Avail.).

Hall et al., "Activated Gas Plasma Surface Treatment of Polymers for Adhesive Bonding", Journal of Applied Polymer Science, vol. 13, pp. 2085–2096 (1969) (No Month Avail.).

Hollahan et al., "Attachment of Amino Groups to Polymer Surfaces by Radiofrequency Plasmas", Journal of Applied Polymer Science, vol. 13, pp. 807–816 (1969) (No Month Avail.).

Vallon et al., "Improvement of the Adhesion of Silica Layers to Polypropylene Induced by Nitrogen Plasma Treatment", Elsevier Science S.A., Thin Solid Films 290–291, pp. 68–73 (1996) (No Month Avail.).

Korner et al., "Hydrogen Plasma Chemical Cleaning of Metallic Substrates and Silicon Wafers", Elsevier Sciences S.A., Surface and Coating Technology 76–77, pp. 731–737 (1995) (No Month Avail.).

Legeay, et al. "Surface Modification of Natural or Synthetic Polymers by Cold Plasmas" Thin Solid Films, 1996.

Hall, et al. "Activated Gas Plasma Surface Treatment of Polymers for Adhesive Bonding" Journal of Applied Polymer Science, 1969.

Hollahan, et al. "Attachment of Amino Groups to Polymer Surfaces by Radiofrequency Plasmas" Journal of Applied Polymer Science, 1969.

Korner, et al. "Hydrogen plasma chemical cleaning of metallic substrates and silicon wafers" Surface and Coatings Technology, 1995.

Copy of the Search Report.

*Primary Examiner*—Bernard Pianalto
(74) *Attorney, Agent, or Firm*—Crowell & Moring LLP

(57) ABSTRACT

A process is provided for producing coated synthetic bodies during which, before the coating, the surface to be coated is subjected to a pretreatment in an excited gas atmosphere. The surface is then coated. The gas atmosphere is predominantly formed of a noble gas and nitrogen and/or hydrogen, and the ionic energy in the gas atmosphere and in the are of the surface to be coated is not more than 50 eV. The ionic energy is selected to be not more than 20 eV, preferable not more than 10 eV. The gas atmosphere is excited by means of a plasma discharge or by means of UV radiation.

20 Claims, 1 Drawing Sheet

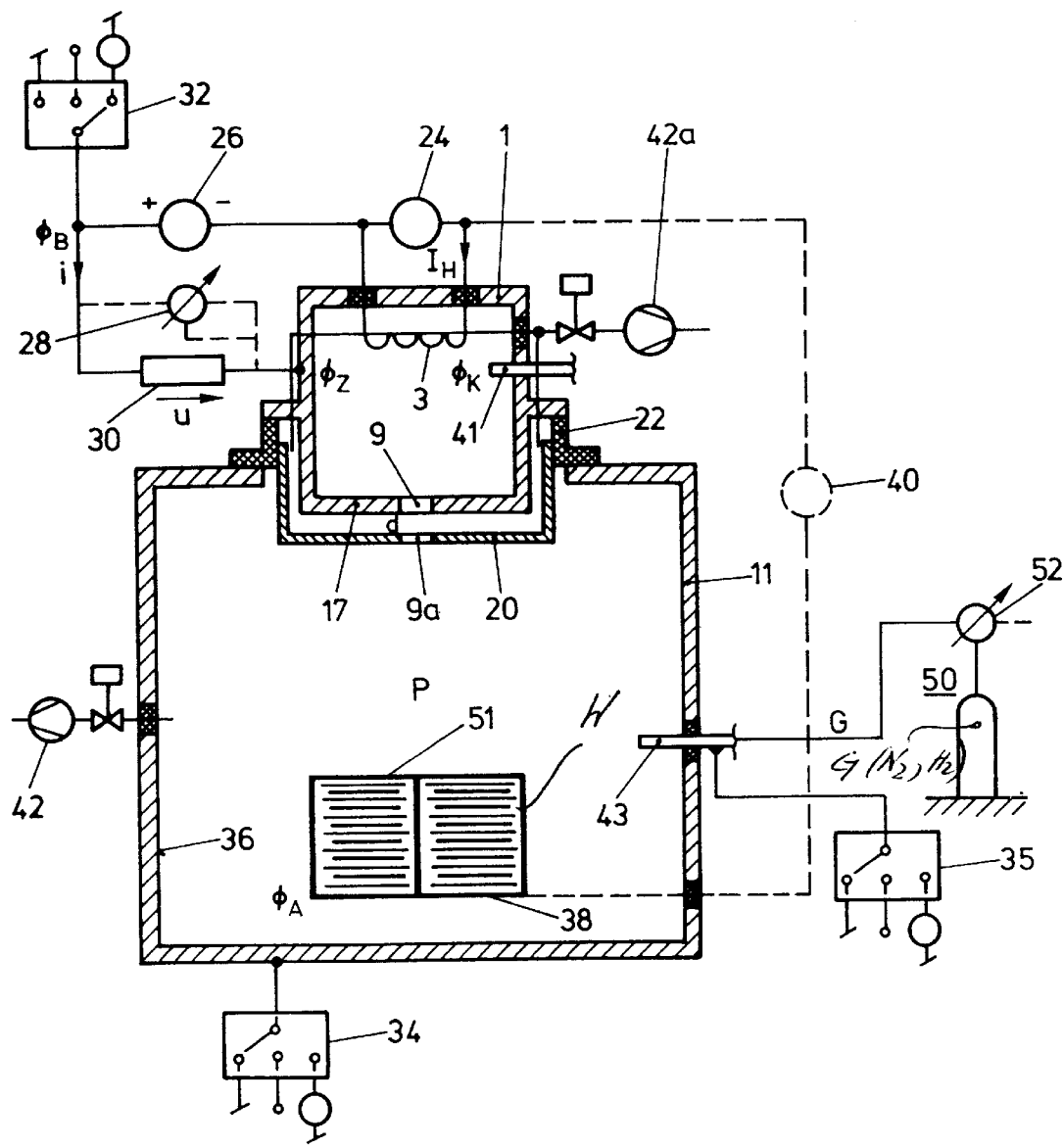

PROCESS FOR MANUFACTURING COATED PLASTIC BODY

CROSS-REFERENCE TO RELATED APPLICATIONS

This application is related to co-pending U.S. patent application Ser. No. 09/257,207, filed Feb. 25, 1999 and to Ser. No. 09/172,598 filed on Oct. 15, 1998, now U.S. Pat. No. 6,203,637.

BACKGROUND OF THE INVENTION

The present invention relates to a process for producing coated synthetic bodies during which, before the coating, the surface to be coated is subjected to a pretreatment in an excited gas atmosphere.

The present invention is based on the understanding that, in producing coated synthetic bodies, the synthetic material, the coating material as well as the coating process determine the additional specific measures for obtaining a satisfactory coating adhesion on the synthetic surface. This results in an extremely large variety of different additional measures which must be taken in order to ensure, in each case, specifically, the adhesion of a certain coating on a synthetic body of a certain material.

Therefore, the following explanations only have the purpose of showing examples and corresponding known starting points of solutions.

SUMMARY OF THE INVENTION

From the lecture by G. Legeay, "Surface Modification of Natural or Synthetic Polymers by Cold Plasmas", given at the 2nd Conf. Plasma Chem. Tech. 1984, it has become known to increase the adhesion of a metal coating on synthetic surfaces by a prior plasma treatment of the surface. For example, oxygen-containing, helium-containing and carbon-containing gases are used for the plasma pretreatment.

The use of helium or oxygen plasma discharges for treating synthetic surfaces is also known from the technical essay by J. Hall from *J. Appl. Polym. Sci.* Vol. 13, 1969. The plasma treatment explained here has the object of achieving an improved conglutinating capacity of synthetic materials.

From the technical essay by J. Hollahan from *J. Appl. Polym. Sci.* Vol 13, 1969, it has been known to expose synthetic materials to a plasma treatment by ammonia-containing, nitrogen-containing and hydrogen-containing gas for improving the surface adhesion and the wettability. In such an application, a high-frequency plasma discharge is used. In U.S. Pat. No. 4,957,603, the difficulties are discussed which occur when coating optical disks made of PMMA, namely that this synthetic material is particularly difficult to coat when a cathode atomization process is used. Another known process for increasing the adhesion of a coating on synthetic surfaces is the intermediate coating by oxides or nitrides.

For metal coating particularly a PMMA synthetic body by magnetron cathode atomizing, EP 0 507 113 suggests that the coating be carried out in a plasma-excited gas atmosphere of argon and at least another inert gas, and in the process change the mixture ratio of the gas atmosphere in a controlled manner during the coating process.

DE 197 52 889 suggests improvement of the abrasion resistance of applied indium tin oxide (ITO) layers on optical components, such as monitoring windows, flat panel displays, cathode ray tubes, in that, during the coating operation, the surface to be coated is bombarded with argon ions with an energy of from 60 eV to 90 eV. When coating organic surfaces, for example, polymethylmethacrylate (PMMA), before the coating, a plasma treatment is carried out on the surface in a vacuum while feeding reactive oxygen and gas containing water.

CH 688 042, it is known to provide a synthetic surface by a magnetic-field-supported atomizing in a gas atmosphere of argon-containing and carbon-containing gas.

Furthermore, during the sputter coating of PMMA surfaces, in contrast to the coating of polycarbonate surfaces, during the target change, that is, when a new target is used, or during a longer opening of the process chamber with respect to the ambient atmosphere, problems occur because of the fact that the sputtering surface of the target is covered by an oxide layer. For the sputtering-away of this oxide layer, a better vacuum is required in the starting phase than when the coating process is in progress. The strong gas exhalation of the PMMA, in comparison, for example, to polycarbonate, impairs the vacuum conditions such that a change from the so-called oxide mode to the metallic mode is made impossible. This problem can be solved in that, for the presputtering, that is, for starting the process, argon is used as the sputtering gas and polycarbonate disks are used as dummy substrates. This considerably complicates and prolongs the starting procedure. The fact that aluminum coatings adhere poorly to polycarbonate surfaces, is intentionally utilized by Warner Advanced Media Operation, specifically for producing DVD14 and DVD18 disks.

SUMMARY OF THE INVENTION

An object of the present invention is to provide a process which (a) in practice, is to be usable as a standard process, within wide limits independently of the material of the synthetic surface to be coated, of the used coating technique and of the used coating material. It has the purpose of ensuring an equally good adhesion of the applied coating particularly for materials which, as known, are difficult to coat, such as especially PMMA, but also for less critical synthetic materials, such as polycarbonate, bismaleimide triazine (BT) resins, fire-inhibiting epoxy glass laminates, particularly FR4 as well as for surfaces which are to be coated with photosensitive resists and/or solderable lacquers as well as similar materials of the semiconductor industry and for printed circuit board materials, and (b) solves the above-mentioned problems when sputter coating PMMA and similar materials.

According to the invention, this object is achieved by predominantly forming the gas atmosphere of argon, nitrogen and/or hydrogen, and limiting the ionic energy in the gas atmosphere and in the area of the surface to be coated to not more than 50 eV. In this case, the ionic energy is preferably selected to be not more than 20 eV, preferably not more than 10 eV.

Surprisingly, as a result of the combination of the above-mentioned gas atmosphere and of the above-mentioned low ionic energies, the above-mentioned objects are combinantly achieved. If, for example, oxygen is used instead of hydrogen and/or nitrogen, this effect cannot be achieved, no matter whether or not the condition with respect to the ionic energy has been met. This effect also does not occur in the case of a hydrogen plasma and/or nitrogen plasma, at which higher ionic temperatures occur, as normally takes place in the case of a plasma excitation at HF.

Thus, according to the invention, a low-energy argon/ nitrogen and/or hydrogen plasma is used for the pretreatment of the synthetic surfaces to be coated.

In this case, the excitation of the gas atmosphere preferably takes place by way of a plasma discharge or by UV radiation. Low-energy plasmas which are primarily suitable for the use within the scope of the present invention are microwave or ECR discharges, but preferably low-voltages discharges. HF or timed DC plasma discharges can be used if the pressure conditions are selected correspondingly and/ or the discharge is maintained so far away from the synthetic surface to be pretreated that the above-mentioned low-energy conditions are met on the above-mentioned surface. As mentioned above, a low-voltage discharge is preferably used; preferably with an electron-emitting hot cathode or the gas excitation by means of UV radiation with H and N lines.

Argon is preferably used as the noble gas.

Surprisingly, it was found during the implementation of the production process according to the invention that significant advantages are obtained other than with respect to the adhesion of the subsequently applied coating and with respect to the implementation of the process when sputter coating PMMA surfaces or surfaces of similar critical synthetic materials as a result of the above-mentioned pretreatment according to the invention, the production process can also easily be carried out while including a storage time of the pretreated synthetic surfaces in a normal atmosphere. That is, the surfaces pretreated within the scope of the process according to the invention are passivated, this passivation, for being undone, subsequently requiring no further measures for the further treatment, specifically for the coating.

In a preferred embodiment of the process according to the invention, the coating is carried out by a vacuum coating process. In this case, plasma polymerization, a reactive or non-reactive PVD process or a PECVD process is preferably used.

In a particularly preferred manner, the coating takes place by plasma polymerization or by reactive or non-reactive sputtering; in this case, preferably by magnetron sputtering or by a reactive or non-reactive vapor coating; whether by electron beam vaporizing, by vaporizing from a heated crucible or by spark vaporizing.

Furthermore, the process according to the invention is used particularly on the above-mentioned critical synthetic materials, specifically on PMMA surfaces or surfaces consisting of BT or FR4.

Furthermore, the synthetic body is preferably coated with a metal or a metal compound, such as a nitride, oxide, carbide or their mixed forms.

The production process according to the invention is particularly preferably used for the production of optical disks, for the production of optical components, for printed circuit boards or for components in the field of semiconductor manufacturing.

BRIEF DESCRIPTION OF THE DRAWINGS

Other objects, advantages and novel features of the present invention will become apparent from the following detailed description of the invention when considered in conjunction with the accompanying drawings.

The single FIGURE shows an exemplary system configuration for implementing at least the pretreatment step within the framework of the production process according to the invention.

DETAILED DESCRIPTION OF THE DRAWINGS

A thermionic cathode 3 is mounted in a cathode chamber 1 in an insulated manner. Portions 17 of the cathode chamber 1 surround a screen opening 9. The cathode chamber 1 is mounted by way of insulation supports 22 on the wall of the treatment chamber 11. A shield 20, which is operated in a potential-floating manner with respect to the cathode chamber 1 as well as with respect to the treatment chamber 11, encloses the portions 17 at a dark-space distance d directly into the area of the screen opening 9. The thermionic cathode 3 is operated by a source 24 with heating current $I_H$ and is guided, by way of a voltage source 26 and, generally, a unit 28 to at least a portion of the cathode chamber wall, preferably onto the cathode chamber wall itself. The unit 28 acts as a current control and, as function of the current i flowing through it, causes a voltage drop u. As illustrated by a broken line, the voltage drop u can be implemented by a current-controlled voltage source but is preferably implemented by a passive switching element, in this case, particularly by a resistance element 30.

The positive pole of the voltage source 26 can be applied to a reference potential, whether this is the ground or another defined potential, or can be operated without a potential, as illustrated purely schematically by the contingency change-over switch 32. Likewise, because the treatment chamber 11 is electrically insulated from the cathode chamber 1, as illustrated only schematically by the contingency change-over switch 34, it can be operated on the ground potential, on a reference potential or optionally even in a potential-floating manner. The interior wall 36 of the treatment chamber or at least portions thereof can be switched as the anode with respect to the thermionic cathode 3. However, preferably a separate anode 38 is provided, as illustrated by a broken line, which anode 38 is wired anodically, that is, positively, by way of a voltage source 40 with respect to the thermionic cathode 3. In this case, the anode 38 is preferably used as the workpiece carrier for the schematically shown workpieces W. By way of the gas feeding line 41, a noble gas, preferably argon, is fed to the cathode chamber as the working gas. By way of another, schematically illustrated gas feeding line 43, as schematically illustrated by the contingency change-over switch 35, being applicable to the potential depending on the placing of the potential of the chamber 11, the hydrogen-containing and/or nitrogen-containing gas G is fed. The gas G is admitted by way of a schematically illustrated valve 52.

A pump arrangement 42 is provided in order to pump down the chamber 11 and optionally the cathode chamber 1, in which case, as illustrated, a pump arrangement 42a can additionally be provided in order to pump down the cathode chamber separately. The screen arrangement with the screen opening 9 acts as a pressure stage between pressure in the cathode chamber 1 and pressure in the treatment chamber 11.

The wall of the cathode chamber 1 forms the ignition electrode. For igniting the low-voltage discharge, the thermionic cathode 3 is heated by the heating current $I_H$, for the electron emission, and argon is admitted into the cathode chamber. On the basis of the distance relation between the wall of the cathode chamber 1 and the cathode 3, by way of applying the potential of the latter, the ignition of the discharge takes place, whereupon a current i flows through the unit 28, particularly the resistance 30. Thus, the potential $\Phi_z$ of the cathode chamber 17, which was previously at the ignition value, is reduced, whereby, during the operation, the wall of the chamber 1 acts as an anode only to a negligible extent, and the primary discharge is drawn through the screen arrangement with the opening 9 to the treatment-chamber-side anode 38.

The system illustrated in the above-described FIGURE is used to pretreat all synthetic bodies which are to be coated as now described:

Pretreatment

The steps include:

Placing the substrates in the treatment chamber.

Pumping down the treatment chamber to a pressure of not more than $10^{-4}$ mbar.

Admitting argon to a pressure in the range of between $2\times10^{-4}$ mbar and $5\times10^{-2}$ bar, preferably to approximately $5\times10^{-3}$ mbar.

Admitting hydrogen or nitrogen or a hydrogen/nitrogen mixture until a pressure between $3\times10^{-4}$ mbar and $10^{-1}$ mbar, preferably up to a total pressure of approximately $8\times10^{-3}$ mbar, is reached.

Switching on the hot-cathode heating current $I_H$ until the electron emission starts.

Applying a voltage between the hot cathode 3 and the ground potential, resulting in a discharge current between 1A and 200A.

Using ionic energies <50 eV, for example, approximately 15 eV, 12 eV.

Plasma treating for 10 minutes.

Ventilating the treatment chamber.

Previous plasma measurements (Korner, N. et al.) showed that, under the above-mentioned process conditions, the plasma potential differs from the ground potential by only approximately 2V. The approximate ionic energies can be derived from the difference between the plasma potential and the substrate potential.

1st EXAMPLE
Coating of PMMA Bodies by Plasma Polymerization

Ionic energy during the pretreatment: 15 eV

Holding time of the pretreated PMMA substrates at the normal atmosphere until the coating: 1 h to 12 h Subsequently, the coating was carried out in a capacitively coupled high-frequency (13.56 MHz) plasma reactor with plasma polymerization by using hexamethyl disiloxane (HMDSO). For this coating, the pretreated substrates were charged into the plasma reactor which was pumped down to a pressure of $10^{-3}$ bar. Subsequently, 50 sccm HMDSO was admitted by way of a gas flow regulator and, at a reactor output of 500 W and the occurring pressure of $1.2\times10^{-2}$ mbar, plasma polymers were deposited for 45 min. After the end of the coating, the layer thickness is 2 µm. The layer consisting of plasma polymers is colorless and transparent.

2nd EXAMPLE
Sputter Coating of Synthetic PMMA Bodies

Ionic energy during the pretreatment: 12 eV

Holding time after the pretreatment at the normal atmosphere until the coating: 1 h to 3 days After the pretreatment, individual bodies (disk-shaped) were charged by way of an automatic handling system into the transfer canal of the coating chamber. The transfer canal was pumped down to approximately 1 mbar. Then the bodies were transferred from the transfer canal into the coating chamber (same vacuum). A coating with aluminum took place by DC sputtering at a power of approximately 6 kW for 2 seconds (25 nm/sec.). The body was then removed through the transfer canal.

3rd EXAMPLE
Coating of Plastic Eyeglasses

After the pretreatment according to the invention (see above), a number of eyeglasses were charged into a batch coating system. After the coating chamber was pumped down to $10^{-4}$ mbar, argon was admitted up to a pressure of $5\times10^{-3}$ mbar. The timed DC sputtering of a silicon target with the addition of oxygen ($8\times10^{-3}$ mbar) resulted in an $SiO_x$ layer on the eyeglasses.

4th EXAMPLE
Vapor Coating of Various Synthetic Substrates

Substrates made of various synthetic materials were pretreated according to the invention (see above).

Subsequently, the substrates were charged into a vaporization chamber which was pumped down to $10^{-5}$. Under a screen, aluminum was vaporized in a crucible by an electron beam vaporizer. After the screen was opened, a coating took place at a coating rate of 1 nm/sec. After 50 seconds, the screen was closed and the electron beam vaporizer was stopped. After another 10 minutes,, the chamber was aerated and the substrates were removed.

5th EXAMPLE
Foil Coating

Plastic foils were pretreated according to the invention (see above) (using ionic energies of approximately 8 eV). Subsequently, the foils were vacuum-coated with Si, SiGe or Ge.

6th EXAMPLE
Copper Layers on PMMA Substrates

PMMA substrates were pretreated according to the invention (see above). In this case, different pretreatment process parameters were set, specifically (a)

Gas flow $Ar/N_2$: 20/20 sccm discharge current: 40 A plasma treatment time: 10 min.

(b)

Gas flow $Ar/N_2/H_2$: 20/20/10 sccm discharge current: 40 A plasma treatment time: 10 min.

(c)

Gas flow $Ar/H_2$: 20/20 sccm discharge current: 40 A plasma treatment time: 10 min.

In some cases, the plasma pretreatment was preceded by a liquid purification in an ultrasonic bath with DI water.

The pretreated PMMA substrates were coated by sputtering with a copper layer of a thickness of 128 and 256 nm.

RESULTS

In all the above examples, substrates which had been pretreated according to the invention and then coated were compared with identical, unpretreated, identically coated substrates. The adhesion of the respective layers was tested by means of the Scotch Tape Test according to MIL-STD-810A and MIL-M-13508. In all cases, a much better layer adhesion had occurred on the substrates pretreated according to the invention in comparison to the layer adhesion on substrates which had not been pretreated.

If, according to the above-mentioned Scotch Tape Test, the value 1.0 is defined by the fact that, after the Scotch tape is pulled off, 100% of the layer remains on the substrate, and correspondingly the value 0.0 is defined by the fact that the whole layer adheres to the Scotch tape. As an example, during the evaluation of the substrates of Example 6, an adhesion of 1.0 n the PMMA substrates was obtained in the case of the copper layer with a thickness of 128 nm as well as in the case of the copper layer with a thickness of 256 nm. This is so irrespective of whether the pretreatment took place according to (a) or (b) or (c) In all coating processes, the ionic energy required according to the invention was maintained.

Without any preceding pretreatment according to the invention, in the case of the layer of a thickness of 128 nm, the adhesion values fluctuated between 0.2 and 0.7, and in the case of the layer of a thickness of 256 nm, between 0.0 and 0.7, irrespective of whether the substrates had additionally been subjected to the liquid purification.

As mentioned above, the pretreatment of the synthetic bodies according to the invention has excellent results, among others, in the case of aluminum, copper, silver, silicon, germanium coatings; further, in the case of coatings with compound semiconductors (3–5, 2–6), with metal oxides as well as metal nitrides.

The ionic energy of the plasma for maintaining the required maximal energies can be determined by plasma monitors or by the determination of the difference between the plasma potential and the substrate potential.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for manufacturing coated synthetic bodies, comprising subjecting a surface of said bodies to a pretreatment in an atmosphere of excited gas at least predominantly formed by a noble gas and at least one of nitrogen and of hydrogen, limiting the ion energy of ions of said excited gas upon said surface to be coated to at most 50 eV, and coating said pre-treated surface.

2. The method of claim 1, wherein said coated body is one of an optical disc, an optical component, a printed circuit board, and a part for manufacturing a semiconductor device.

3. The method of claim 1, wherein said surface is coated with one of a semiconductor, a metal and a metal compound.

4. The method of claim 1, wherein said surface to be coated consists of one of PMMA, BT and FR4.

5. The method of claim 1, further comprising performing said coating by reactive or non-reactive vapor coating.

6. The method of claim 1, further comprising performing said coating by reactive or non-reactive sputtering.

7. The method of claim 6, further comprising performing said reactive or non-reactive sputtering by reactive or non-reactive magnetron sputtering.

8. The method of claim 1, further comprising performing said coating by one of plasma polymerization, reactive or non-reactive PVD or a PECVD process.

9. The method of claim 1, further comprising performing said coating with a vacuum coating process.

10. The method of claim 1, further comprising exposing said pretreated surface to ambient before performing said coating.

11. The method of claim 1, further comprising providing argon as said noble gas.

12. The method of claim 1, further comprising exciting said gas with UV-radiation with H and N lines.

13. The method of claim 1, further comprising exciting said gas with a low-voltage discharge.

14. The method of claim 1, further comprising limiting said ion energy to be at most 20 eV.

15. The method of claim 1, further comprising limiting said ion energy to be at most 10 eV.

16. The method of claim 1, further comprising exciting said gas with a plasma discharge or with UV-radiation.

17. The method of claim 1, further comprising exciting said gas with a microwave discharge.

18. The method of claim 1, further comprising exciting said gas with an ECR-discharge.

19. The method of claim 1, further comprising exciting said gas with a RF discharge.

20. The method of claim 1, further comprising exciting said gas with a chopped DC-discharge.

* * * * *